United States Patent
Lo et al.

(10) Patent No.: US 7,632,616 B2
(45) Date of Patent: Dec. 15, 2009

(54) CONTROLLING SYSTEM AND METHOD FOR OPERATING THE SAME

(75) Inventors: Chao-Lung Lo, Hsinchu (TW); Ta-Hung Yang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 628 days.

(21) Appl. No.: 11/306,417

(22) Filed: Dec. 28, 2005

(65) Prior Publication Data

US 2007/0145005 A1    Jun. 28, 2007

(51) Int. Cl.
*G03F 9/00* (2006.01)
*G03C 5/00* (2006.01)

(52) U.S. Cl. .................. 430/30; 430/313; 430/330; 250/492.3; 356/451; 356/496; 356/511; 356/636; 382/145; 382/149

(58) Field of Classification Search .................. 430/30, 430/313, 330; 382/145, 149; 250/492.3; 356/451, 496, 511, 636
See application file for complete search history.

(56) References Cited

U.S. PATENT DOCUMENTS 7,405,032 B1 *   7/2008   Amblard et al. ............. 430/311
2004/0038139 A1   2/2004   Mui et al. ..................... 430/30

* cited by examiner

*Primary Examiner*—Christopher G Young
(74) *Attorney, Agent, or Firm*—Jianq Chyun IP Office

(57) ABSTRACT

The invention is directed to a method for controlling a critical dimension of a patterned photoresist layer. The method comprises steps of measuring a critical dimension of a raised pattern in a patterned photoresist layer after a photolithography process is performed on the photoresist layer. A determining process is performed to determine whether the critical dimension is within a critical dimension control limit range, wherein the critical dimension control limit range has a upper control limit and a lower control limit. An adjusting process is performed when the critical dimension is not within the critical dimension control limit range. When the critical dimension is smaller than the lower control limit, a photoresist reflow process is performed. When the critical dimension is larger than the upper control limit a photoresist trimming process is performed.

19 Claims, 4 Drawing Sheets

CONTROLLING SYSTEM AND METHOD FOR OPERATING THE SAME

BACKGROUND OF THE INVENTION

1. Field of Invention

The present invention relates to a controlling system and a method for operating the same. More particularly, the present invention relates to a critical dimension controlling system and a method for operating the same.

2. Description of Related Art

In the manufacture of integrated circuit, photolithography process is used to transfer patterns from a photo mask having customized circuit patterns to thin films formed on a wafer. The image transfer process comprises steps of forming a photoresist layer on a non-process layer, illuminating the photoresist layer through a photo mask having the customized circuit patterns, developing the photoresist layer and then etching the non-process layer by using the patterned photoresist layer as a mask. Hence, the image transfer process is accomplished.

However, the critical dimension of the pattern in the photoresist layer is affected by several factors including the exposure dosage, thickness of the photoresist layer and the variables in the development process. Therefore, for the different wafers in the same process procedure of the same product line, the critical dimension of the pattern formed in the material layer by using the patterned photoresist layer could be varied.

For a particular process procedure, a critical dimension control limit range is defined according to the specification of the product line. If the critical dimension of the pattern of the patterned photoresist layer on a wafer is beyond the critical dimension control limit range, the device element formed by using the patterned photoresist layer could behave undesirably and abnormally.

SUMMARY OF THE INVENTION

Accordingly, at least one objective of the present invention is to provide a method for controlling a critical dimension of a patterned photoresist layer. By using the method according to the present invention, the critical dimension of each wafer in the same product line can be well controlled.

At least another objective of the present invention is to provide a controlling system for controlling a critical dimension of a patterned photoresist layer. By using the controlling system, the critical dimension of each wafer in the same product line can adjusted to be within a critical dimension control limit range.

To achieve these and other advantages and in accordance with the purpose of the invention, as embodied and broadly described herein, the invention provides a method for controlling a critical dimension of a patterned photoresist layer. The method comprises steps of measuring a critical dimension of a raised pattern in a patterned photoresist layer after a photolithography process is performed on the photoresist layer. A determining process is performed to determine whether the critical dimension is within a critical dimension control limit range, wherein the critical dimension control limit range has a upper control limit and a lower control limit. An adjusting process is performed when the critical dimension is not within the critical dimension control limit range. When the critical dimension is smaller than the lower control limit, a photoresist reflow process is performed. When the critical dimension is larger than the upper control limit a photoresist trimming process is performed.

In the embodiment of the present invention, the photoresist reflow process is performed, according to a reflow recipe, by reheating the patterned photoresist layer to enlarge the critical dimension. The reflow recipe is selected from a recipe database. Furthermore, the photoresist trimming process is performed, according to a trim recipe, by etching the patterned photoresist layer to shrink the critical dimension. The trim recipe is selected from a recipe database. Moreover, the method comprises a step of repeating the step of performing the adjusting process until the critical dimension of the adjusted raised pattern is within the critical dimension control limit range.

The present invention also provides a method for controlling a critical dimension of a line-space pattern in a patterned photoresist layer. The method comprises steps of measuring a critical dimension of a space pattern of the line-space pattern. A determining process is performed to determine whether the critical dimension is within a critical dimension control limit range, wherein the critical dimension control limit range has an upper control limit and a lower control limit. An adjusting process is performed when the critical dimension is not within the critical dimension control limit range. When the critical dimension is larger than the upper control limit, a photoresist reflow process is performed. When the critical dimension is smaller than the lower control limit, a photoresist trimming process is performed.

In the present invention mentioned above, the photoresist reflow process is performed, according to a reflow recipe, by reheating the patterned photoresist layer to enlarge the critical dimension. The reflow recipe is selected from a recipe database. Furthermore, the photoresist trimming process is performed, according to a trim recipe, by etching the patterned photoresist layer to shrink the critical dimension. The trim recipe is selected from a recipe database. Moreover, the method comprises a step of repeating the step of performing the adjusting process until the critical dimension of the adjusted raised pattern is within the critical dimension control limit range.

The present invention further provides a controlling system for controlling a critical dimension of a patterned photoresist layer on each wafer of a group of wafers in a product line. The controlling system comprises a measuring tool, a determining tool, a recipe database and an adjusting tool. The measuring tool is used for measuring a critical dimension of a pattern of the patterned photoresist layer. The determining tool is used for determining whether the critical dimension is within a critical dimension control limit range, wherein the critical dimension control limit range has a upper control limit and a lower control limit. The recipe database is used for storing a plurality of trim recipes and a plurality of reflow recipes. The adjusting tool is used for adjusting the critical dimension when the critical dimension is not within the critical dimension control limit range.

In the aforementioned embodiment of the present invention, the adjusting tool comprises a reflowing tool and a trimming tool. Under the situation that the pattern of the patterned photoresist layer is a raised pattern, the reflowing tool is used for performing a photoresist reflow process according to the reflow recipe selected from the recipe database when the critical dimension of the raised pattern is smaller than the lower control limit and the trimming tool is used for performing a photoresist trimming process according to the trim recipe selected from the recipe database when the critical dimension of the raised pattern is larger than the upper control limit. Under the situation that the pattern of the patterned photoresist layer is a space pattern, the reflowing tool is used for performing a photoresist reflow process according to the reflow recipe selected from the recipe database when the critical dimension of the space pattern is larger than the upper control limit and the trimming tool is used for performing a photoresist trimming process according to the trim recipe selected from the recipe database when the critical dimension of the space pattern is smaller than the lower control limit. The reflowing tool includes a heating plate and the trimming tool includes an etching machine. Furthermore, the measuring tool includes a scanning electron microscopy (SEM). Moreover, the trim recipes and the reflow recipes are classified according to the type of the product line, a manufacturing factor set of a material layer which is going to be patterned by using the patterned photoresist layer and a plurality of photoresist layer factors. Also, the photoresist layer factors include the thickness of the photoresist layer and the material of the photoresist layer.

In the present invention, since an adjusting process is applied before the patterned photoresist layer is used as a mask in a patterning process, the critical dimension of the pattern in the patterned photoresist layer can be well controlled. For the different wafers in the same process procedure of the same product line, the critical dimension of the pattern in the patterned photoresist layer is maintained to be within the critical dimension control limit range. Therefore, the quality of the pattern transferred onto the material layer by using the patterned photoresist layer in the same product line is well controlled.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
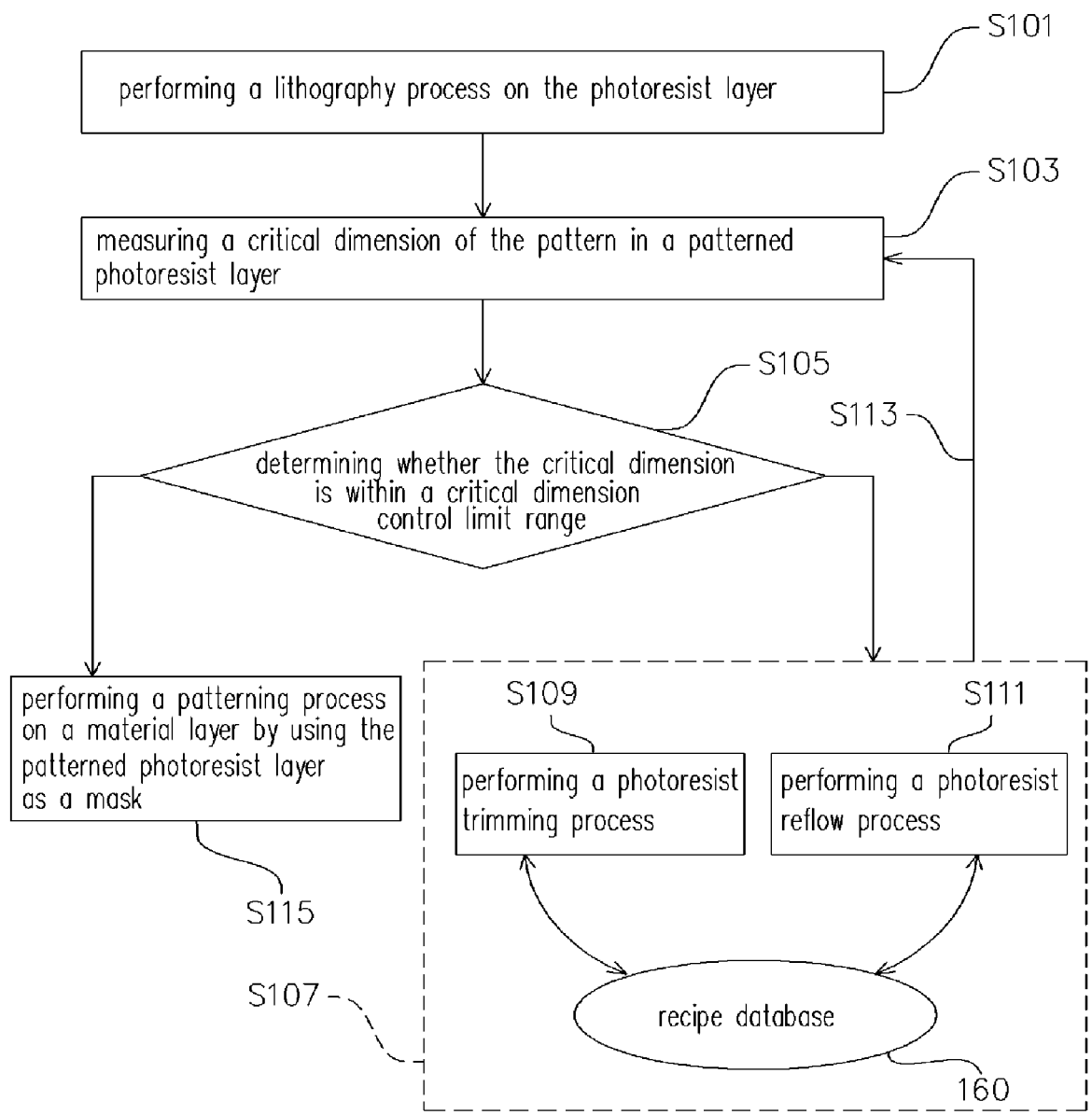
FIG. 1 is a flow chart schematically illustrating a method for controlling a critical dimension of a patterned photoresist layer according to a preferred embodiment of the invention.

FIG. 1 is a flow chart schematically illustrating a method for controlling a critical dimension of a patterned photoresist layer according to a preferred embodiment of the invention. As shown in FIG. 1, in the step S101, a photolithography process is performed on a photoresist layer formed over a substrate. The photolithography process comprises steps of performing an exposure process and a development process to transfer the pattern on the mask onto the photoresist layer. According to different product lines and different material layers under the patterned photoresist layer, the pattern in the patterned photoresist layer is different. The pattern can be, for example, line-space pattern. Then, a critical dimension of the pattern in the patterned photoresist layer is measured by a measuring tool (step S103). The measuring tool for measuring the critical dimension can be, for example but not limited to, a scanning electron microscopy (SEM) or an optical metrology tool such as the. Spectroscopic Ellipsometry or the Optical Reflectometry.

Moreover, the measured critical dimension is determined whether it is within a critical dimension control limit range (step S105). The critical dimension control limit range is determined upon the specification of the element which is going to be formed by using the patterned photoresist layer. The critical dimension control limit range comprises an upper control limit and a lower control limit. If the measured critical dimension is beyond the critical dimension control limit range, an adjusting process is performed (step S107).

Under the situation that pattern whose critical dimension is measured is a raised pattern, when the critical dimension of the raised patterned is larger than the upper limit of the critical dimension control limit range with respect to the raised pattern, a photoresist trimming process is performed (step S109). On the other hand, when the critical dimension of the raised patterned is smaller than the lower limit of the critical dimension control limit range with respect to the raised pattern, a photoresist reflow process is performed (step S111). The photoresist trimming process is performed, according to a trim recipe selected from a recipe database 160, to decrease the critical dimension of the raised pattern. The photoresist trimming process includes an etching process. Furthermore, the photoresist reflow process is performed, according to a reflow recipe selected from the recipe database 160, to increase the critical dimension of the raised pattern. The photoresist reflow process includes a heating process performed by using a heating plate.

Figure 2A:
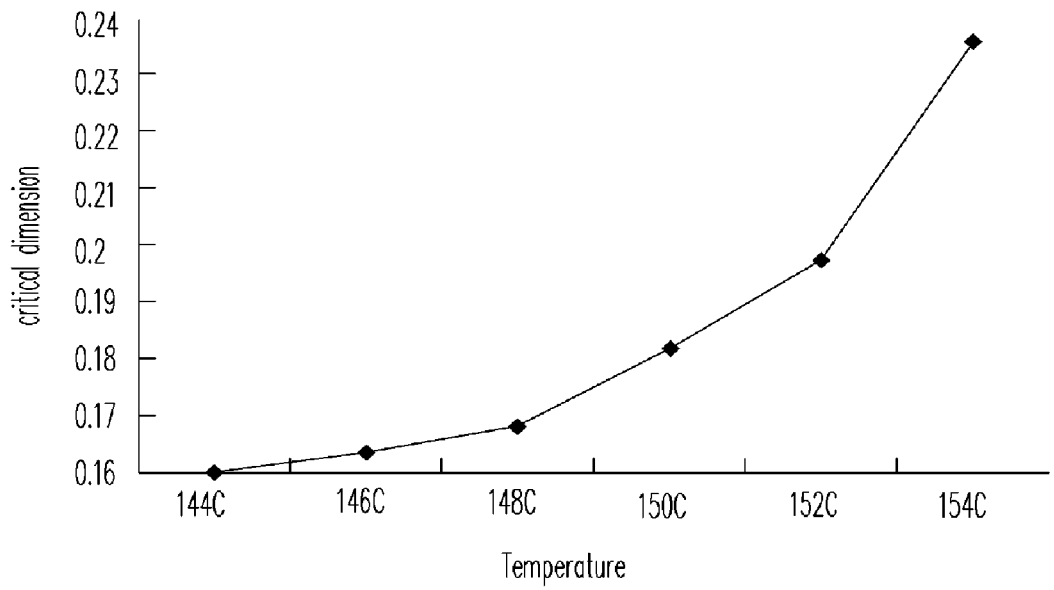
FIG. 2A is a critical dimension-temperature plot diagram with respect to the raised pattern.

FIG. 2A is a critical dimension-temperature plot diagram with respect to the space pattern. As shown in FIG. 2A, with the increasing of the temperature, it is clearly that the critical dimension of the raised pattern is enlarged.

Under the situation that pattern whose critical dimension is measured is a space pattern of the line-space pattern, when the critical dimension of the space patterned is smaller than the lower limit of the critical dimension control limit range with respect to the space pattern, a photoresist trimming process is performed (step S109). On the other hand, when the critical dimension of the space patterned is larger than the upper limit of the critical dimension control limit range with respect to the space pattern, a photoresist reflow process is performed (step S111). The photoresist trimming process is performed, according to a trim recipe selected from a recipe database 160, to increase the critical dimension of the space pattern. The photoresist trimming process includes an etching process. Furthermore, the photoresist reflow process is performed, according to a reflow recipe selected from the recipe database 160, to decrease the critical dimension of the space pattern. The photoresist reflow process includes a heating process performed by using a heating plate.

Figure 2B:
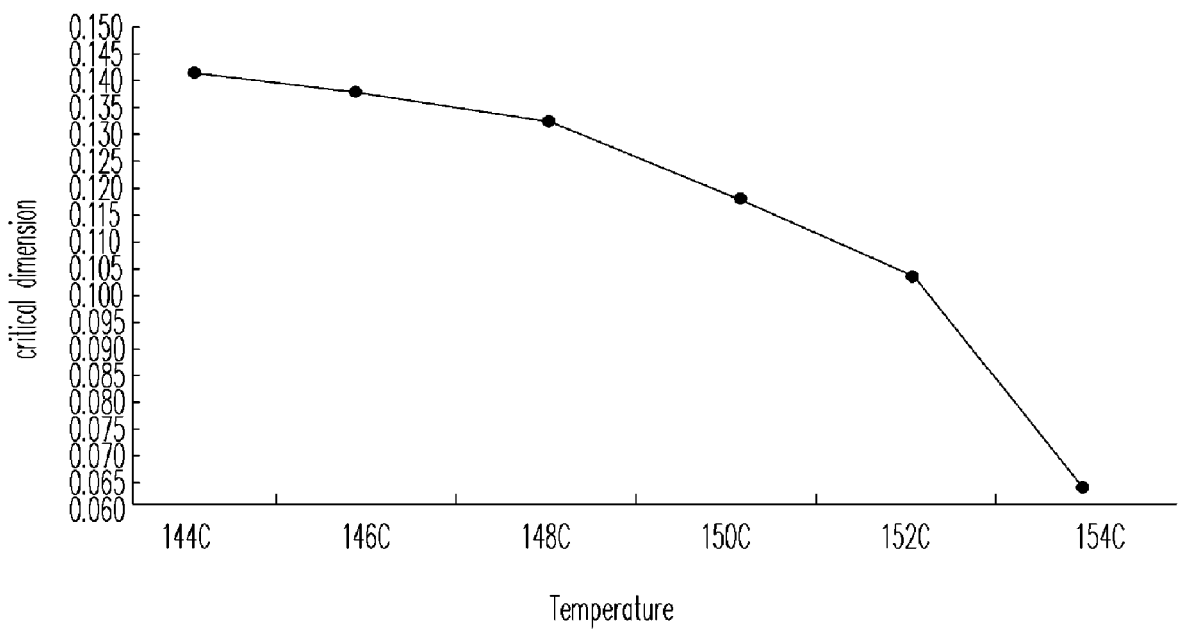
FIG. 2B is a critical dimension-temperature plot diagram with respect to the space pattern.

FIG. 2B is a critical dimension-temperature plot diagram with respect to the space pattern. As shown in FIG. 2B, with the increasing of the temperature, it is clearly that the critical dimension of the space pattern is shrunk.

After the adjusting process is performed (step S107), a repeating process is performed (step S113) to measure the adjusted critical dimension, to adjust the critical dimension again until the critical dimension is within the critical dimension control limit range. Then, since critical dimension falls in the critical dimension control limit range, a patterning process is performed to pattern the material layer under the patterned photoresist layer by using the patterned photoresist layer as a mask (step S115).

Figure 3:
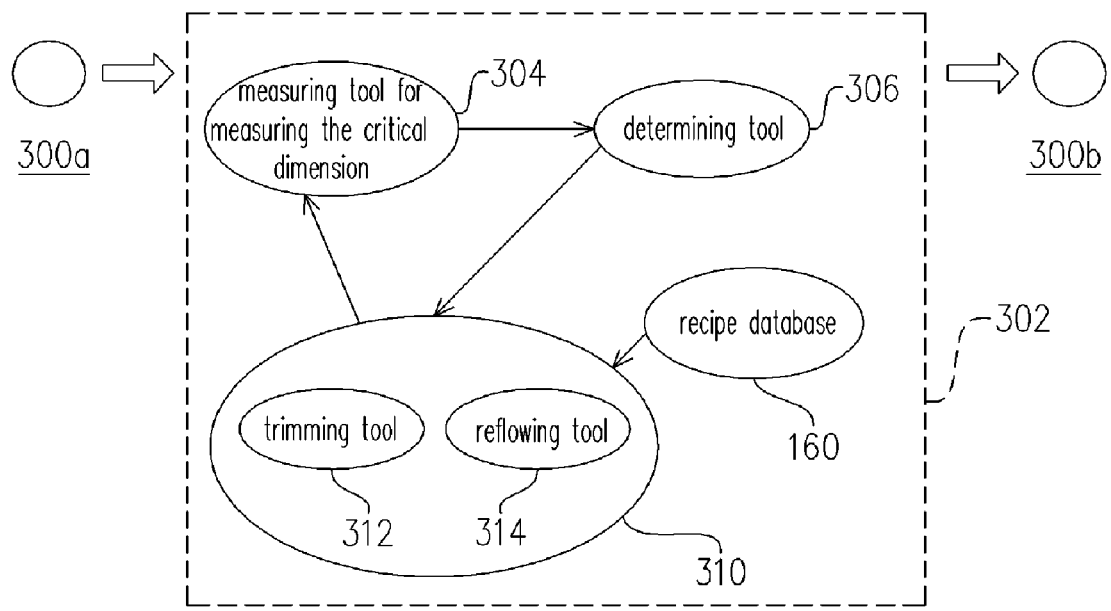
FIG. 3 is a schematically diagram showing a controlling system for controlling a critical dimension of a patterned photoresist layer in a product line.

FIG. 3 is a schematically diagram showing a controlling system for controlling a critical dimension of a patterned photoresist layer in a product line. As shown in FIG. 3, a wafer 300a in a product line is provided to the controlling system 302 after a patterned photoresist layer is formed thereon. In the controlling system 302, there are a measuring tool 304, a determining tool 306, an adjusting tool 310 and the recipe database 160. The measuring tool 304 is used to measure a critical dimension of the patterned photoresist. The measuring tool 304 can be, for example but not limited to, a scanning electron microscopy (SEM). The determining tool 306 is used to determine whether the measured critical dimension is within a critical dimension control limit range. The adjusting tool 310 is used to adjust the critical dimension if the critical dimension is beyond the critical dimension control limit range. As mentioned above, the critical dimension is adjusted by using either a trimming tool 312 or a reflowing tool 314 according to a trim recipe or a reflow recipe selected from the recipe database 160. The trimming tool 312 can be, for example but not limited to, an etching machine. The reflowing tool 314 can be, for example but not limited to, a heating plate.

Figure 4:
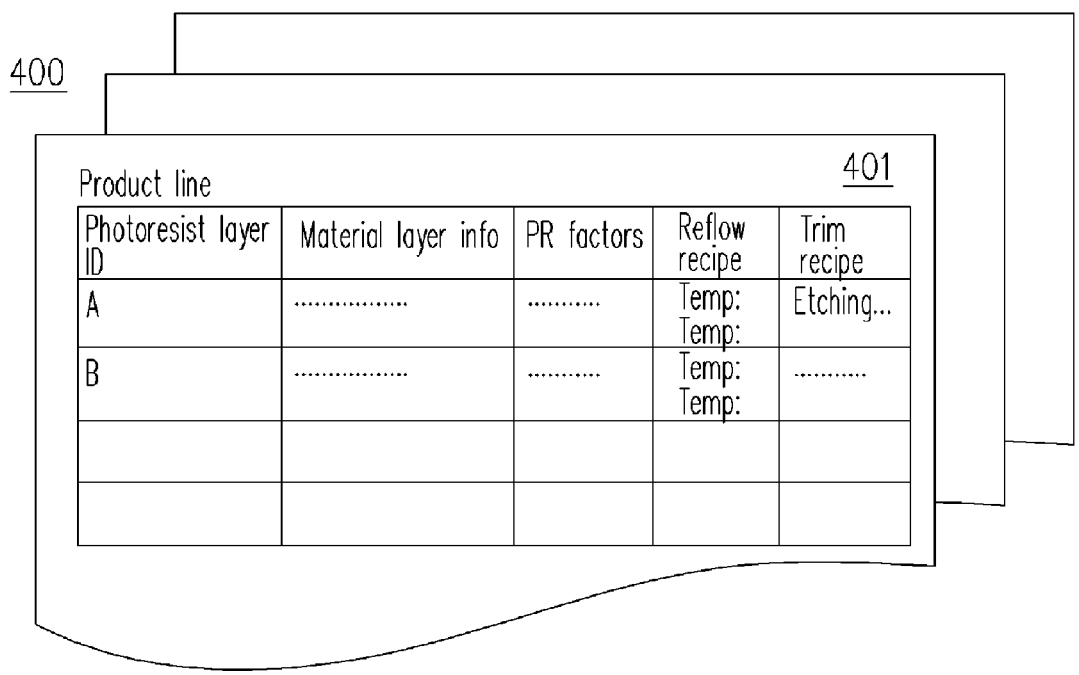
FIG. 4 is a schematically view showing a recipe database.

FIG. 4 is a schematically view showing a recipe database. As shown in FIG. 4, the recipe database 400 comprises several data pages 401. For example but not limited to, the recipes in the recipe database 400 are classified, according to the product lines, into different data pages 401. On each data page 401, the recipes are classified according to the element property of the product, the manufacturing factor set of a material layer which is going to be patterned by using the patterned photoresist layer as a mask (column labeled as material information) and the photoresist layer factors (the column labeled as PR factors). The photoresist layer factors include, for example but not limited to, the thickness of the photoresist layer and the material of the photoresist layer.

For a particular photoresist layer (as stated in the column labeled photoresist layer ID), a trim recipe and a reflow recipe including heating time and temperature are described respectively. Preferably, for a particular photoresist layer in the column labeled photoresist layer ID, critical dimension-temperature diagrams respectively with respect to the raised pattern and the space pattern are provided.

Figure 5:
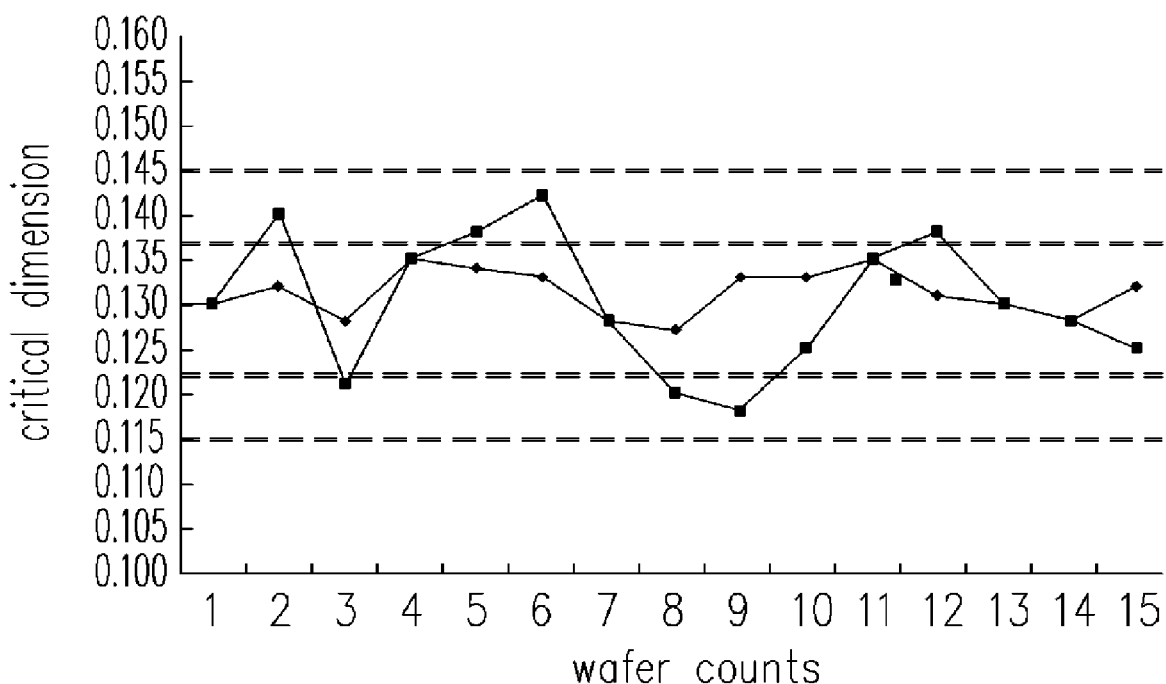
FIG. 5 is a critical dimension-wafer counts plot diagram.

FIG. 5 is a critical dimension-wafer counts plot diagram with respect to a raised pattern. As shown in FIG. 5, the measured critical dimension of each wafer in the same product line including 15 pieces wafers before the adjusting process is applied is denoted by a square spot. Moreover, the critical dimension of each wafer in the same product line after the adjusting process is applied is represented as a diamond shape spot. For the particular product line, the critical dimension specification limit range is between 0.115-0.145 μm. That is, the upper limit and the lower limit of the critical dimension specification limit range are 0.145 μm and 0.115 μm respectively. Similarly, the critical dimension control limit range is between 0.1225-0.1375 μm. That is, the upper limit and the lower limit of the critical dimension control limit range are 0.1375 μm and 0.1225 μm respectively. It is clear that, before the adjusting process is applied, some of the critical dimensions of the wafers are beyond the critical dimension control limit range. That is, the critical dimensions of the raised pattern of the patterned photoresist layer on the wafers labeled 2, 5, 6 and 12 are larger than the upper limit of the critical dimension control limit range (0.1375 μm). Similarly, the critical dimensions of the raised pattern of the patterned photoresist layer on the wafers labeled 3, 8 and 9 are smaller than the lower limit of the critical dimension control limit range (0.1225 μm). Therefore, before the adjusting process is applied, the critical dimensions of the wafers in the same product line dramatically varies. Hence, functionality of the device elements formed by using the patterned photoresist layer vary because the pattern quality of the patterned photoresist layer is not even.

However, by applying the adjusting process, the critical dimension of the raised pattern of the patterned photoresist layer on each wafer is adjusted and within the critical dimension control limit range. Therefore, the quality of the device elements formed by using the patterned photoresist layer can be well controlled.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for controlling a critical dimension of a patterned photoresist layer, the method comprising:
   measuring a critical dimension of a raised pattern in a patterned photoresist layer after a photolithography process is performed on the photoresist layer;
   after the critical dimension is measured, determining whether the critical dimension is within a critical dimension control limit range, wherein the critical dimension control limit range has a upper control limit and a lower control limit;
   after the critical dimension is determined not within the critical dimension control limit range, performing an adjusting process, wherein
      when the critical dimension is smaller than the lower control limit, a photoresist reflow process is performed; and
      when the critical dimension is larger than the upper control limit a photoresist trimming process is performed.

2. The method of claim 1, wherein the photoresist reflow process is performed, according to a reflow recipe, by reheating the patterned photoresist layer to enlarge the critical dimension.

3. The method of claim 2, wherein the reflow recipe is selected from a recipe database.

4. The method of claim 1, wherein the photoresist trimming process is performed, according to a trim recipe, by etching the patterned photoresist layer to shrink the critical dimension.

5. The method of claim 4, wherein the trim recipe is selected from a recipe database.

6. The method of claim 1, further comprising a step of repeating the step of performing the adjusting process until the critical dimension of the adjusted raised pattern is within the critical dimension control limit range.

7. A method for controlling a critical dimension of a line-space pattern in a patterned photoresist layer, the method comprising:
   measuring a critical dimension of a space pattern of the line-space pattern;
   after the critical dimension is measured, determining whether the critical dimension is within a critical dimension control limit range, wherein the critical dimension control limit range has a upper control limit and a lower control limit;

after the critical dimension is determined not within the critical dimension control limit range, performing an adjusting process, wherein when the critical dimension is larger than the upper control limit, a photoresist reflow process is performed; and when the critical dimension is smaller than the lower control limit, a photoresist trimming process is performed.

8. The method of claim 7, wherein the photoresist reflow process is performed, according to a reflow recipe, by reheating the patterned photoresist layer to enlarge the critical dimension of the space pattern.

9. The method of claim 8, wherein the reflow recipe is selected from a recipe database.

10. The method of claim 7, wherein the photoresist trimming process is performed, according to a trim recipe, by etching the patterned photoresist layer to shrink the critical dimension.

11. The method of claim 10, wherein the trim recipe is selected from a recipe database.

12. The method of claim 7, further comprising a step of repeating the step of performing the adjusting process until the critical dimension of the adjusted space pattern is within the critical dimension control limit range.

13. A controlling system for controlling a critical dimension of a patterned photoresist layer on each wafer of a group of wafers in a product line, the controlling system comprising:

a measuring tool for measuring a critical dimension of a space pattern of the patterned photoresist layer;

a determining tool for determining whether the critical dimension is within a critical dimension control limit range after the critical dimension is measured, wherein the critical dimension control limit range has a upper control limit and a lower control limit;

a recipe database storing a plurality of trim recipes and a plurality of reflow recipes; and an adjusting tool for adjusting the critical dimension after the critical dimension is determined not within the critical dimension control limit range.

14. The controlling system of claim 13, wherein the adjusting tool comprises:

a reflowing tool for performing a photoresist reflow process according to the reflow recipe selected from the recipe database when the critical dimension of the space pattern is larger than the upper control limit; and a trimming tool for performing a photoresist trimming process according to the trim recipe selected from the recipe database when the critical dimension of the space pattern is smaller than the lower control limit.

15. The controlling system of claim 14, wherein the reflowing tool includes a heating plate.

16. The controlling system of claim 14, wherein the trimming tool includes an etching machine.

17. The controlling system of claim 13, wherein the measuring tool is selected from a group consisting of a scanning electron microscopy (SEM) and the Spectroscopic Ellipsometry and the Optical Reflectometry.

18. The controlling system of claim 13, wherein the trim recipes and the reflow recipes are classified according to the type of the product line, a manufacturing factor set of a material layer which is going to be patterned by using the patterned photoresist layer and a plurality of photoresist layer factors.

19. The controlling system of claim 13, wherein the photoresist layer factors include the thickness of the photoresist layer and the material of the photoresist layer.

* * * * *

UNITED STATES PATENT AND TRADEMARK OFFICE
CERTIFICATE OF CORRECTION

PATENT NO. : 7,632,616 B2 Page 1 of 1
APPLICATION NO. : 11/306417
DATED : December 15, 2009
INVENTOR(S) : Lo et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 980 days.

Signed and Sealed this

Second Day of November, 2010

David J. Kappos
*Director of the United States Patent and Trademark Office*